(12) United States Patent
Nakayama et al.

(10) Patent No.: US 10,464,322 B2
(45) Date of Patent: Nov. 5, 2019

(54) PIEZOELECTRIC DEVICE, LIQUID EJECTING HEAD, AND LIQUID EJECTING APPARATUS

(71) Applicant: SEIKO EPSON CORPORATION, Tokyo (JP)

(72) Inventors: Masao Nakayama, Shiojiri (JP); Motoki Takabe, Shiojiri (JP); Eiju Hirai, Azumino (JP); Shiro Yazaki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/029,033

(22) Filed: Jul. 6, 2018

(65) Prior Publication Data
US 2019/0009539 A1    Jan. 10, 2019

(30) Foreign Application Priority Data

Jul. 10, 2017    (JP) .................................. 2017-134400

(51) Int. Cl.
*B41J 2/175*    (2006.01)
*B41J 2/14*    (2006.01)

(52) U.S. Cl.
CPC ....... *B41J 2/14233* (2013.01); *B41J 2/17563* (2013.01); *B41J 2002/14306* (2013.01); *B41J 2002/14403* (2013.01); *B41J 2002/14419* (2013.01); *B41J 2002/14491* (2013.01)

(58) Field of Classification Search
CPC ................ B41J 2/14233; B41J 2/17563; B41J 2002/14306; B41J 2002/14491; B41J 2002/14403; B41J 2002/14419; B41J 2/14201
See application file for complete search history.

(56) References Cited

U.S. PATENT DOCUMENTS

2006/0250456 A1\* 11/2006 Matsuzawa .......... B41J 2/14233
                                                                347/68
2012/0320131 A1    12/2012 Kato et al.

FOREIGN PATENT DOCUMENTS

JP    2013-000993 A    1/2013

\* cited by examiner

*Primary Examiner* — Geoffrey S Mruk
(74) *Attorney, Agent, or Firm* — Workman Nydegger

(57) ABSTRACT

A piezoelectric device used in a liquid ejecting head that ejects liquid from a nozzle includes a flow path forming substrate in which an individual liquid chamber that communicates with the nozzle, and a liquid supply chamber that communicates with the individual liquid chamber are formed, a vibration plate formed at a position corresponding to the individual liquid chamber and the liquid supply chamber of the flow path forming substrate, a plurality of liquid supply ports formed in the liquid supply chamber, and a piezoelectric element including a first electrode, a piezoelectric layer, and a second electrode, the piezoelectric element being formed at a position on the vibration plate corresponding to the individual liquid chamber. A metal layer is stacked at a position on the vibration plate corresponding to the liquid supply chamber. The liquid supply ports are provided so as to penetrate the vibration plate and the metal layer.

15 Claims, 5 Drawing Sheets

PIEZOELECTRIC DEVICE, LIQUID EJECTING HEAD, AND LIQUID EJECTING APPARATUS

The entire disclosure of Japanese Patent Application No. 2017-134400, filed Jun. 10, 2017 is expressly incorporated by reference herein.

BACKGROUND

1. Technical Field

The present invention relates to a piezoelectric device including a piezoelectric element, a liquid ejecting head including the piezoelectric device, and a liquid ejecting apparatus provided with the liquid ejecting head.

2. Related Art

An example of a piezoelectric device used in an ink jet recording head which is a typical example of a liquid ejecting head is a piezoelectric device including a flow path forming substrate provided with an individual flow path communicating with a nozzle and provided with a liquid supply chamber communicating with the individual flow path, and a piezoelectric element provided on one surface side of the flow path forming substrate via a vibration plate.

A configuration has been disclosed for an ink jet recording head having such a piezoelectric device in which a plurality of liquid supply ports communicating with a liquid supply chamber are provided on a vibration plate, which allows the vibration plate to have a filter function (see, for example, JP-A-2013-000993).

However, in the case where liquid supply ports are formed in the vibration plate, there is a problem that the vibration plate is easily damaged because ink supply pressure is applied to the vibration plate.

Therefore, in JP-A-2013-000993, the vibration plate that forms the liquid supply ports is formed by stacking many layers, whereby the internal stress of the vibration plate is regulated in order to suppress the damage to the vibration plate. However, when a large number of layers are stacked on one another and the vibration plate becomes thick, the deformation of the piezoelectric element is impeded and the displacement characteristic deteriorates.

Further, such a problem exists not only in the ink jet recording head but also in a piezoelectric device used in a liquid ejecting head which ejects liquid other than ink.

SUMMARY

An advantage of some aspects of the invention is that a piezoelectric device, a liquid ejecting head, and a liquid ejecting apparatus in which damage to a film around liquid supply ports is suppressed without impeding displacement of the piezoelectric element are provided.

A piezoelectric device according to a first aspect of the invention used in a liquid ejecting head that ejects liquid from a nozzle includes a flow path forming substrate in which an individual liquid chamber that communicates with the nozzle, and a liquid supply chamber that communicates with the individual liquid chamber are formed, a vibration plate formed at a position corresponding to the individual liquid chamber and the liquid supply chamber of the flow path forming substrate, a plurality of liquid supply ports formed in the liquid supply chamber, and a piezoelectric element including a first electrode, a piezoelectric layer, and a second electrode, the piezoelectric element being formed at a position on the vibration plate corresponding to the individual liquid chamber, where a metal layer is stacked at a position on the vibration plate corresponding to the liquid supply chamber, and where the liquid supply ports are provided so as to penetrate the vibration plate and the metal layer.

In this case, by providing the liquid supply ports so as to penetrate the vibration plate and the metal layer, damage due to cracks or the like in the vibration plate and the metal layer around the liquid supply ports caused by the pressure of the liquid supplied to the liquid supply chamber can be suppressed. In addition, because damage due to cracks or the like in the vibration plate and the metal layer around the liquid supply ports can be suppressed without changing the configuration of the vibration plate and the piezoelectric element, it is possible to suppress an increase in the thickness of the vibration plate as a result of stacking a large number of layers and restrain the vibration plate from impeding the displacement of the piezoelectric element.

It is preferable that the metal layer be formed of the same material as the first electrode or the second electrode. Accordingly, by forming the metal layer with the same material as that of the first electrode or the second electrode, it is possible to suppress an increase in materials of different types and to reduce cost.

It is preferable that the metal layer be formed in the same layer as the first electrode or the second electrode. Accordingly, the metal layer can be formed simultaneously with the first electrode or the second electrode and the cost can be reduced.

It is preferable that the metal layer not be electrically connected to the first electrode and the second electrode. Accordingly, it is possible to restrain the first electrode and the second electrode from being electrically connected to the liquid via the metal layer, and it is possible to suppress malfunctioning of the piezoelectric element due to electric leakage.

It is preferable that the vibration plate and the metal layer be formed continuously in the circumferential direction of the liquid supply ports. Accordingly, by providing the vibration plate and the metal layer continuously around the periphery of the liquid supply ports, it is possible to further suppress damage due to cracks or the like to the vibration plate and the metal layer around the liquid supply ports.

A liquid ejecting head according to a second aspect of the invention includes the piezoelectric device of the above aspect.

In this case, it is possible to realize a liquid ejecting head in which damage to a film around supply ports is suppressed without impeding the displacement of the piezoelectric element.

A liquid ejecting apparatus according to a third aspect of the invention includes the liquid ejecting head of the above aspect.

In this case, it is possible to realize a liquid ejecting apparatus in which damage to a film around supply ports is suppressed without impeding the displacement of the piezoelectric element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
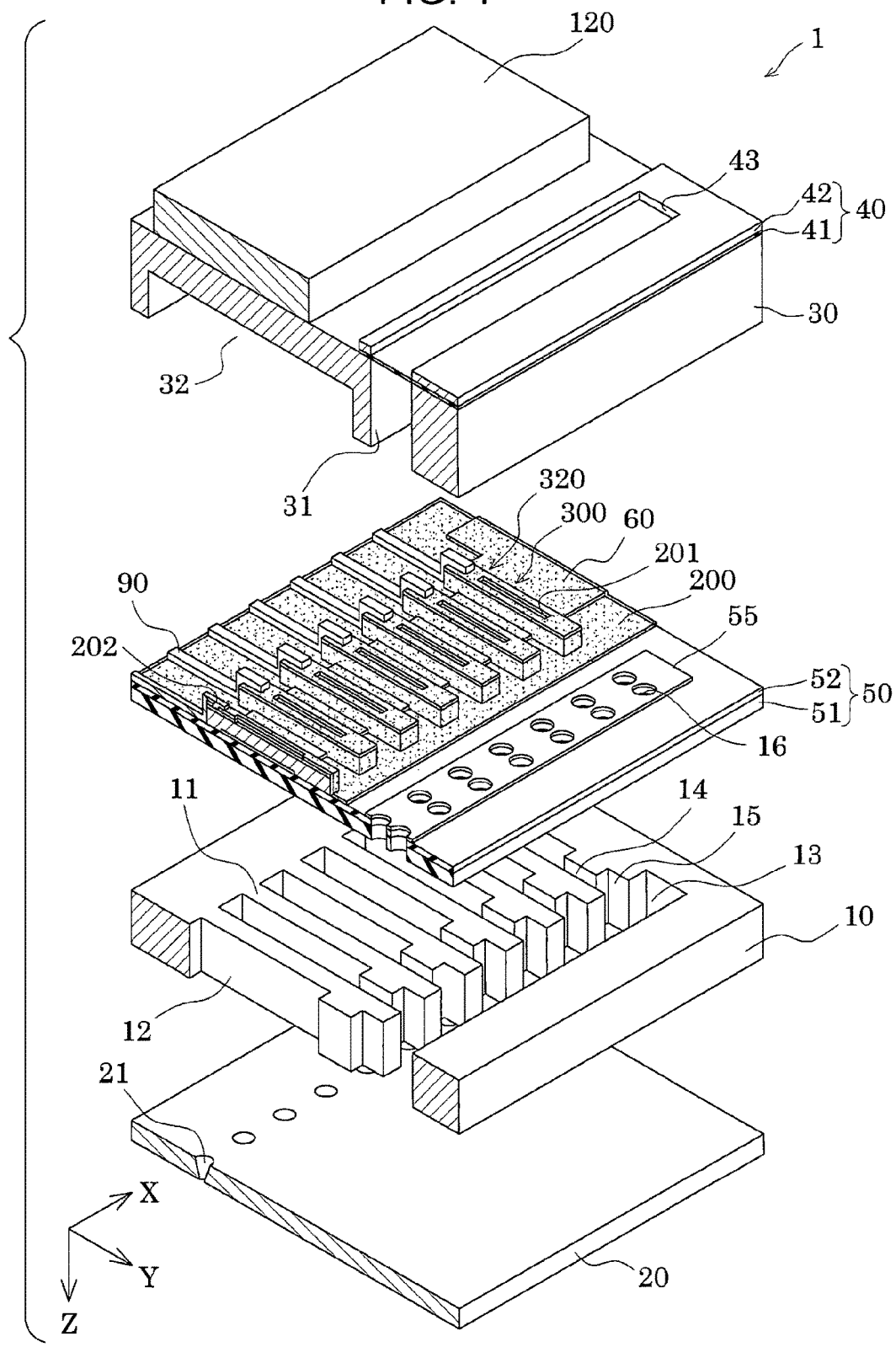
FIG. 1 is an exploded perspective view of a recording head according to a first embodiment of the invention.

Hereinafter, embodiments of the invention will be described with reference to the drawings. However, the following description merely illustrates an embodiment of the invention, and it can be arbitrarily changed within the scope of the invention. In the drawings, the same reference numerals are given to the same members, and explanations thereof are omitted as appropriate. In addition, in each figure, X, Y, and Z represent three spatial axes orthogonal to each other. In this specification, directions along these axes will be described as a first direction X, a second direction Y, and a third direction Z.

First Embodiment

Figure 2:
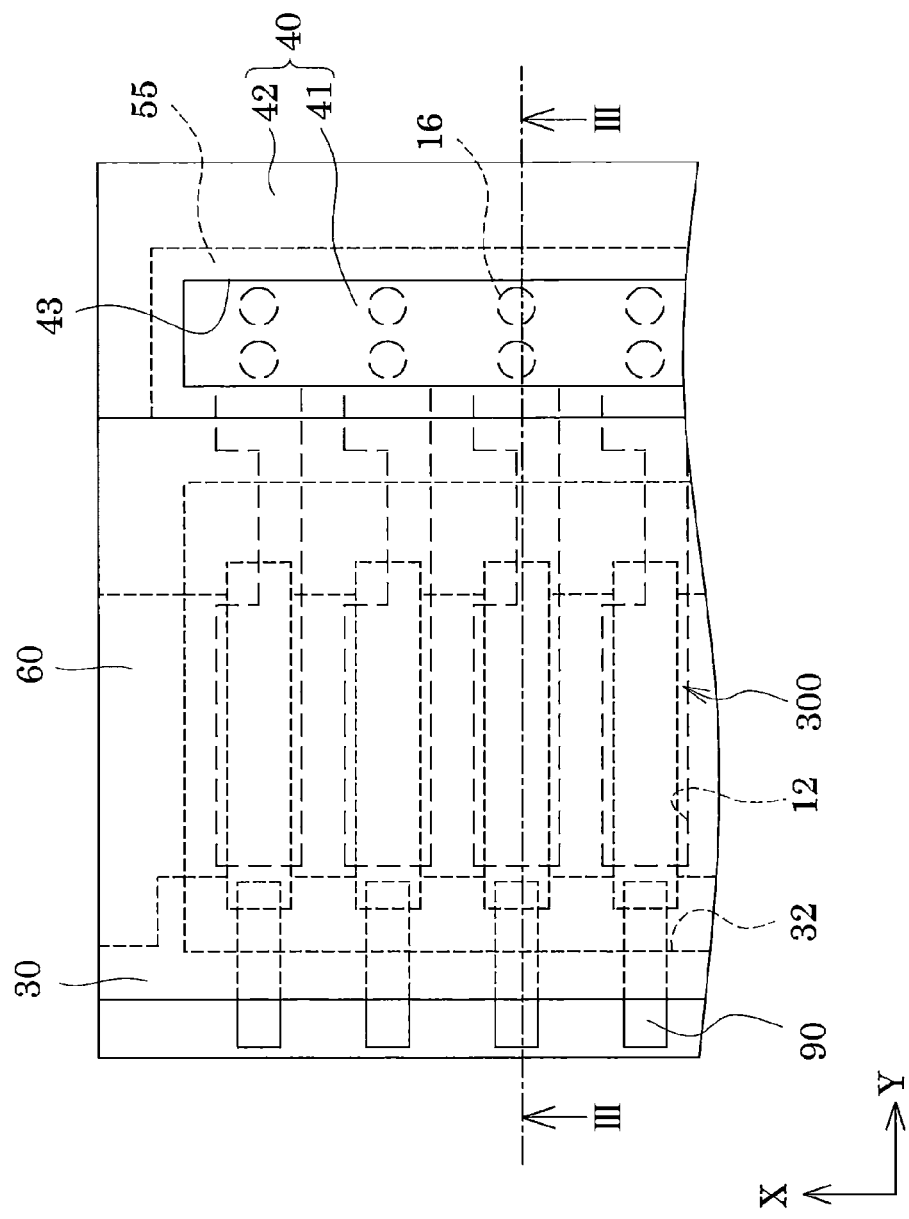
FIG. 2 is a plan view of the recording head according to the first embodiment of the invention.
Figure 3:
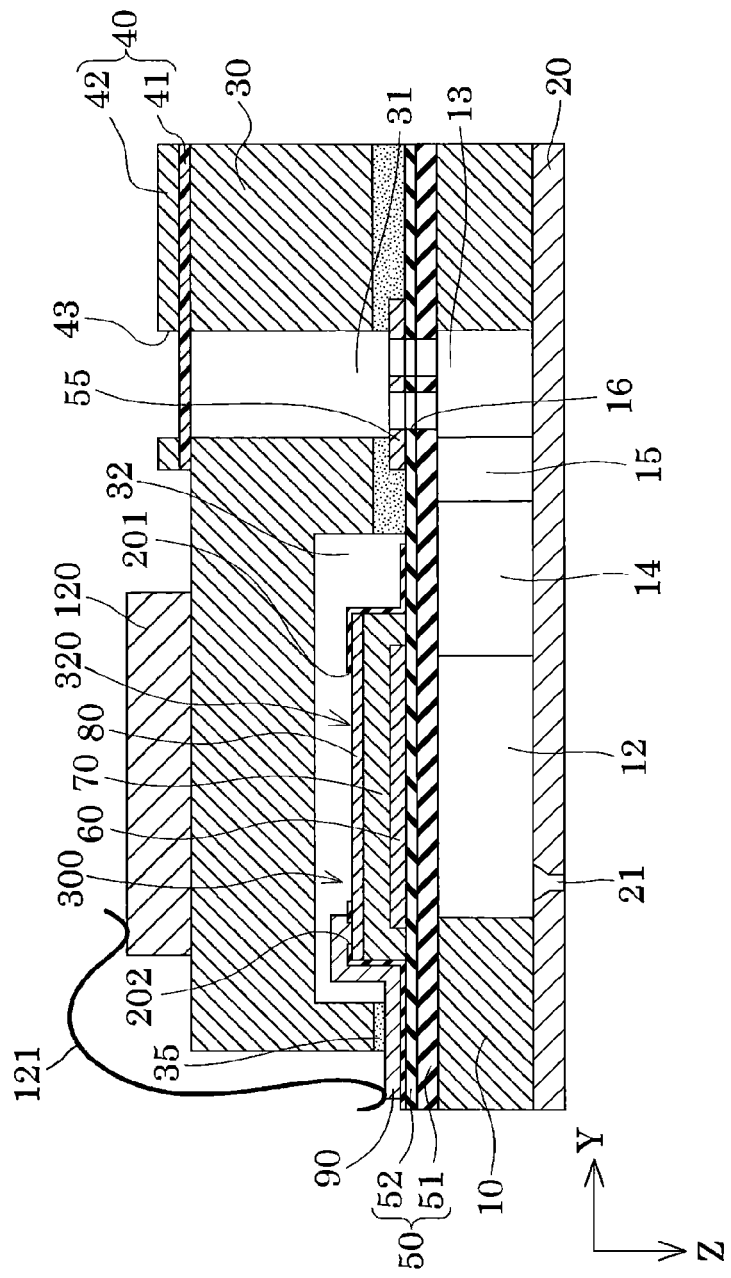
FIG. 3 is a cross-sectional view of the recording head according to the first embodiment of the invention.
Figure 4:
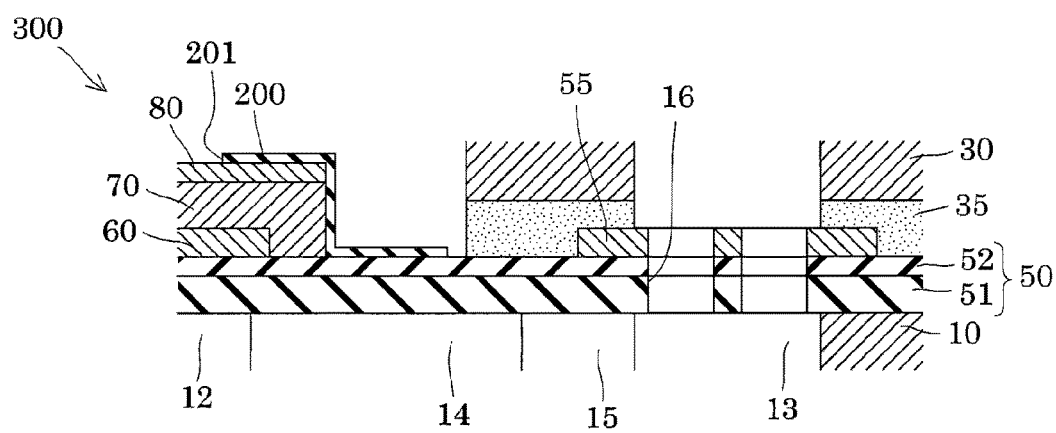
FIG. 4 is an enlarged cross-sectional view of a main portion of the recording head according to the first embodiment of the invention.

FIG. 1 is an exploded perspective view of an ink jet recording head according to a first embodiment of the invention, which is an example of a liquid ejecting head, FIG. 2 is a plan view of the ink jet recording head, FIG. 3 is a cross-sectional view taken along line III-III of FIG. 2, and FIG. 4 is an enlarged view of the main portion of FIG. 3.

As illustrated in the figures, a flow path forming substrate 10 constituting an ink jet recording head 1 (hereinafter, also simply referred to as a recording head 1) can be formed of a metal such as stainless steel or Ni, a ceramic material such as $ZrO_2$ or $Al_2O_3$, a glass ceramic material, an oxide such as $SiO_2$, MgO, or $LaAlO_3$, or the like. In this embodiment, the flow path forming substrate 10 is formed of a single-crystal silicon substrate.

The flow path forming substrate 10 is anisotropically etched from one surface side so that pressure-generating chambers 12 partitioned by a plurality of partition walls 11 are parallelly arranged along the first direction X in which a plurality of nozzles 21 for ejecting ink are parallelly arranged. In addition, in the flow path forming substrate 10, ink supply paths 14 and communication paths 15 are partitioned by the partition walls 11 on one end side of the pressure-generating chambers 12 in the second direction Y. That is, in this embodiment, the flow path forming substrate 10 is provided with the pressure-generating chambers 12, the ink supply paths 14, and the communication paths 15 as individual flow paths communicating with the nozzles 21, respectively.

In addition, at one end of the communication paths 15 in the second direction Y, a communication portion 13 to be a common liquid chamber of each of the pressure-generating chambers 12 is formed. In this embodiment, the communication portion 13 is a liquid supply chamber that supplies ink to the individual flow paths. That is, the flow path forming substrate 10 is provided with liquid flow paths formed of the pressure-generating chambers 12, the communication portion 13, the ink supply paths 14, and the communication paths 15.

The ink supply paths 14 are formed with a narrower width than the pressure-generating chambers 12 in the first direction X and keep the flow path resistance of the ink flowing from the communication portion 13 into the pressure-generating chambers 12 constant. Further, the ink supply paths 14 are not limited to being formed with a narrow width and the height in the third direction Z may be decreased.

A nozzle plate 20 having the nozzles 21 communicating with the vicinity of an end portion of corresponding ones of the pressure-generating chambers 12 on the opposite side to the ink supply paths 14 is fixed by an adhesive, a heat welding film, or the like on the surface side of the flow path forming substrate 10 at which the pressure-generating chambers 12 open. Further, the nozzle plate 20 is formed of a glass ceramic, a single-crystal silicon substrate, stainless steel, or the like.

On the other hand, a vibration plate 50 is formed on the surface of the flow path forming substrate 10 on the opposite side to the nozzle plate 20. In this embodiment, an elastic film 51 formed of silicon oxide provided on the flow path forming substrate 10 side and an insulating film 52 formed of zirconium oxide provided on the elastic film 51 are provided as the vibration plate 50. Further, liquid flow paths such as those of the pressure-generating chambers 12 are formed by anisotropic etching of the flow path forming substrate 10 from the surface side of the flow path forming substrate 10 to which the nozzle plate 20 is joined and the surface of the pressure-generating chambers 12 on the opposite side to the nozzle plate 20 is defined by the elastic film 51.

Further, the elastic film 51 formed of silicon oxide can be formed, for example, by thermally oxidizing the flow path forming substrate 10 formed of a single-crystal silicon substrate. In addition, it is possible to form the insulating film 52 formed of zirconium oxide ($ZrO_2$), for example, by forming a zirconium (Zr) layer on the elastic film 51 by a sputtering method or the like and thermally oxidizing the zirconium layer to form zirconium oxide.

The vibration plate 50 such as that described above may have either a compressive stress or a tensile stress so that the internal stress thereof is suitable for piezoelectric elements 300, that is, optimum with respect to the internal stress of the piezoelectric elements 300. In this embodiment, the internal stress of the vibration plate 50 is a tensile stress.

In addition, in this embodiment, although the elastic film 51 and the insulating film 52 are provided as the vibration plate 50, the configuration is not particularly limited thereto and only one of the elastic film 51 and the insulating film 52 may be provided as the vibration plate 50. In addition, another film may be provided in addition to the elastic film 51 and the insulating film 52 serving as the vibration plate 50. Further, examples of other materials of the vibration plate 50 include silicon nitride (SiN), titanium oxide ($TiO_x$), and the like. That is, as the vibration plate 50, a single layer or a multi-layer body of at least one kind of material selected from silicon oxide ($SiO_2$), silicon nitride (SiN), titanium oxide ($TiO_x$), and zirconium oxide ($ZrO_2$) can be used.

In addition, on the vibration plate 50 of the flow path forming substrate 10, a first electrode 60, a piezoelectric layer 70, and a second electrode 80 are stacked by a film formation and lithography method to form the piezoelectric elements 300. In this embodiment, the piezoelectric elements 300 serve as pressure-generating units for generating a pressure change in the ink in the pressure-generating chambers 12. Here, the piezoelectric elements 300 are also referred to as piezoelectric actuators and are units each including the first electrode 60, the piezoelectric layer 70, and the second electrode 80. In general, one of the electrodes of the piezoelectric elements 300 is used as a common electrode common to the plurality of piezoelectric elements 300, and the other electrode is configured as an independent individual electrode for each of the piezoelectric elements 300. In this embodiment, the first electrode 60 is used as a common electrode and the second electrode 80 is used as an individual electrode, but these may be reversed.

The first electrode 60 is a material capable of maintaining conductivity without oxidizing when the piezoelectric layer 70 is being formed, for example, a noble metal such as platinum (Pt) or iridium (Ir), or a conductive oxide represented by, for example, lanthanum nickel oxide (LNO) or iridium oxide ($IrO_2$), and, furthermore, a multi-layer film formed of the aforementioned may be suitably used.

In addition, as the first electrode 60, an adhesive layer for securing adhesion strength between the above-described conductive material and the vibration plate 50 may be used. In this embodiment, although not specifically illustrated, titanium is used as the adhesive layer. Further, as the adhesive layer, zirconium, titanium, titanium oxide, or the like can be used. That is, in this embodiment, the first electrode 60 is formed of an adhesive layer made of titanium and at least one conductive layer selected from the above-described conductive materials.

The piezoelectric layer 70 is formed of an oxide piezoelectric material having a polarization structure formed on the first electrode 60 for example, the piezoelectric layer 70 can be formed of a perovskite type oxide represented by the general formula $ABO_3$, or a lead-based piezoelectric material containing lead, a lead-free piezoelectric material not containing lead, or the like can be used. The piezoelectric layer 70 can be formed by a liquid phase method such as a sol-gel method or a metal-organic decomposition (MOD) method, a physical vapor deposition (PVD) method (gas phase method) such as a sputtering method or laser ablation method, or the like.

The second electrode 80 is preferably formed of a material capable of satisfactorily forming an interface with the piezoelectric layer 70 and capable of exhibiting conductivity and piezoelectric characteristics, and a noble metal material such as iridium (Ir), platinum (Pt), palladium (Pd), or gold (Au), or a conductive oxide typified by lanthanum nickel oxide (LNO) may be suitably used. In addition, the second electrode 80 may be a multi-layer body formed of a plurality of materials. In this embodiment, a multi-layer electrode of iridium and titanium (where iridium is in contact with the piezoelectric layer 70) is used. The second electrode 80 can be formed by a physical vapor deposition (PVD) method (gas phase method) such as a sputtering method or a laser ablation method, a liquid phase method such as a sol-gel method, a metal-organic decomposition (MOD) method, or a plating method, or the like. In addition, after formation of the second electrode 80, by performing heat treatment, the characteristics of the piezoelectric layer 70 can be improved.

The second electrode 80 such as that described above is formed only on the piezoelectric layer 70, that is, only on the surface of the piezoelectric layer 70 on the opposite side to the flow path forming substrate 10.

In addition, the piezoelectric element 300 is covered with a protective film 200. As the protective film 200, an insulating material having moisture resistance can be used. In this embodiment, the protective film 200 is provided so as to cover the side surface of the piezoelectric layer 70, and the side surface and peripheral portion of the upper surface of the second electrode 80. That is, the protective film 200 is not provided in the main portion of the second electrode 80, which is the substantially central region of the upper surface of the second electrode 80, and an opening portion 201 that exposes the main portion of the second electrode 80 is provided.

The opening portion 201 is an opening that opens in a rectangular shape along the second direction Y of the piezoelectric element 300 by penetrating the protective film 200 in the third direction Z, which is the thickness direction; for example, the opening portion 201 can be formed by forming the protective film 200 over the entire surface of the flow path forming substrate 10 and patterning the protective film 200.

By covering the side surface of the piezoelectric layer 70 of the piezoelectric element 300 with the protective film 200 as described above, leakage of current between the first electrode 60 and the second electrode 80 can be suppressed and damage to the piezoelectric element 300 can be suppressed. In addition, by providing the opening portion 201, it is possible to restrain the displacement of the piezoelectric element 300 from being significantly lowered by the protective film 200. As a material of the protective film 200 such as that described above, any material having moisture resistance may be used, and an inorganic insulating material, an organic insulating material, or the like can be used.

Examples of the inorganic insulating material usable as the protective film 200 include silicon oxide ($SiO_x$), zirconium oxide ($ZrO_x$), tantalum oxide ($TaO_x$), aluminum oxide ($AlO_x$), and titanium oxide ($TiO_x$). As the inorganic insulating material of the protective film 200, in particular, aluminum oxide ($AlO_x$), which is an inorganic amorphous material, for example, alumina ($Al_2O_3$), is preferably used. Further, the protective film 200 formed of an inorganic insulating material can be formed by, for example, an MOD method, a sol-gel method, a sputtering method, a CVD method, or the like.

In addition, as the organic insulating material usable as the protective film 200, for example, at least one selected from an epoxy resin, a polyimide resin, a silicone resin, and a fluorine resin can be used. Further, the protective film 200 formed of an organic insulating material can be formed by, for example, a spin coating method, a spray method, or the like.

A lead electrode 90 formed of, for example, gold (Au) or the like is provided on the protective film 200. One end of the lead electrode 90 is connected to the second electrode 80 via a communication hole 202 provided in the protective film 200 and the other end thereof extends to an end portion of the flow path forming substrate 10 on the opposite side to the ink supply path 14, and the extended tip portion is connected to a drive circuit 120 that drives the piezoelectric element 300, which will be described later, via a connection wire 121.

Furthermore, a protective substrate 30 having a manifold portion 31 for supplying ink to the communication portion 13 is joined to the surface of the flow path forming substrate 10 on the piezoelectric element 300 side. In this embodiment, the flow path forming substrate 10 and the protective substrate 30 are joined using an adhesive 35. The manifold portion 31 of the protective substrate 30 communicates with the communication portion 13 via a plurality of liquid supply ports 16, and the ink from the manifold portion 31 is supplied to the communication portion 13 via the plurality of liquid supply ports 16.

Here, the flow path forming substrate 10 is provided with the vibration plate 50 and a metal layer 55 provided on the vibration plate 50 in a region including the opening of the manifold portion 31. Further, the manifold portion 31 and the communication portion 13 have substantially the same opening. That is, the opening on the communication portion 13 side of the manifold portion 31 and the opening on the manifold portion 31 side of the communication portion 13 have substantially the same area. The metal layer 55 is formed with a slightly larger area than the opening of the manifold portion 31 and, the opening of the manifold portion 31 is included within the metal layer 55 in plan view from the third direction Z. That is, in plan view from the third direction Z, the metal layer 55 is provided in an appropriate size so as to include the opening on the communication portion 13 side of the manifold portion 31 and the opening on the manifold portion 31 side of the communication portion 13.

A plurality of the liquid supply ports 16 for supplying the ink from the manifold portion 31 to the communication portion 13 are provided in the vibration plate 50 and the metal layer 55.

Each of the liquid supply ports 16 has an opening smaller than the opening on the communication portion 13 side of the manifold portion 31 and at least two or more liquid supply ports 16 are provided. Here, "a plurality of the liquid supply ports 16 are provided" means that two or more liquid supply ports 16 are provided for one communication portion 13. For example, in the case where two or more communication portions 13 are provided in the flow path forming substrate 10, it is sufficient for a plurality of the liquid supply ports 16 to be provided for each of the communication portions 13. That is, although a plurality of the liquid supply ports 16 are provided in the vibration plate 50 and the metal layer 55, the case where one liquid supply port 16 is provided for one communication portion 13 is not included in the meaning of "plurality of supply ports" of the invention. By providing two or more liquid supply ports 16 in one communication portion 13, the vibration plate 50 and the metal layer 55 are provided in the form of a canopy over the opening of the communication portion 13 on the protective substrate 30 side.

The liquid supply ports 16 such as those described above penetrate the vibration plate 50 and the metal layer 55. Here, "the liquid supply ports 16 penetrate the vibration plate 50 and the metal layer 55" means that the vibration plate 50 and the metal layer 55 are provided at least in a portion around the liquid supply ports 16. That is, "the vibration plate 50 and the metal layer 55 are provided at least in a portion around the liquid supply ports 16" refers to a configuration in which the vibration plate 50 and the metal layer 55 are continuously provided in the circumferential direction of one liquid supply port 16 as well as a configuration in which the vibration plate 50 and the metal layer 55 are provided discontinuously in the circumferential direction of one liquid supply port 16. In addition, "the vibration plate 50 and the metal layer 55 are provided at least in a portion around the liquid supply ports 16" refers to a configuration in which the vibration plate 50 and the metal layer 55 form a portion of the opening edge portion of the liquid supply ports 16, a configuration in which the vibration plate 50 and the metal layer 55 are formed in a portion between adjacent ones of the liquid supply ports 16, and a configuration in which the vibration plate 50 and the metal layer 55 are formed in a portion between the liquid supply ports 16 and the flow path wall. In this embodiment, the vibration plate 50 and the metal layer 55 are continuously formed in the peripheral edge of the opening edge portion of the liquid supply ports 16.

As the metal layer 55 provided with the liquid supply ports 16 penetrating therethrough, a material having high corrosion resistance to ink is preferable, and a noble metal such as platinum (Pt), iridium (Ir), ruthenium (Ru), osmium (Os), or the like is preferably used.

In addition, it is preferable that the metal layer 55 be formed of the same material as the electrodes constituting the piezoelectric element 300, that is, the first electrode 60 and the second electrode 80. That is, the metal layer 55 may be formed of the same material as the first electrode 60, the metal layer 55 may be formed of the same material as the second electrode 80, or the metal layer 55 may be formed by stacking or alloying the same material as the first electrode 60 and the same material as the second electrode 80. By forming the metal layer 55 with the same material as the first electrode 60 or the second electrode 80 in this way, it is possible to suppress an increase in materials of different types and to reduce the manufacturing cost. It is needless to say that the metal layer 55 may be formed of a material different from that of the first electrode 60 or the second electrode 80.

In addition, the metal layer 55 is preferably formed in the same layer as the first electrode 60 or the second electrode 80. That is, the metal layer 55 may be formed in the same layer as the first electrode 60, the metal layer 55 may be formed in the same layer as the second electrode 80, or the metal layer 55 may be formed by stacking or alloying the same layer as the first electrode 60 and the same layer as the second electrode 80. Here, "the metal layer 55 is formed in the same layer as the first electrode 60 or the second electrode 80" means that the metal layer 55 is formed simultaneously with the first electrode 60 or the second electrode 80. That is, even if the metal layer 55 is formed of the same material as the first electrode 60 or the second electrode 80, if the metal layer 55 is formed in a separate process from the first electrode 60 or the second electrode 80, it is not included in the same layer. By thus forming the metal layer 55 in the same layer as the first electrode 60 or the second electrode 80, it is possible to simplify the manufacturing process without increasing the number of steps of forming the metal layer 55. Therefore, the manufacturing cost can be reduced. Of course, the metal layer 55 may be formed of the same material as the first electrode 60 or the second electrode 80 and formed by a different manufacturing process.

In addition, it is preferable that the metal layer 55 not be electrically connected to the first electrode 60 and the second electrode 80. Here, "the metal layer 55 is not electrically connected to the first electrode 60 and the second electrode 80" means that the metal layer 55, by not being electrically connected to the first electrode 60 and the second electrode 80, is provided so as to be disconnected. If the metal layer 55 is not electrically connected to the first electrode 60 and the second electrode 80, the metal layer 55 may be stacked on the first electrode 60 or the second electrode 80 via an insulating film. By thus electrically disconnecting the metal layer 55 from the first electrode 60 and the second electrode 80, it is possible to restrain the first electrode 60 and the second electrode 80 from being electrically connected to the ink via the metal layer 55 and thereby suppress malfunction of the piezoelectric element 300 due to electric leakage. Of course, the metal layer 55 may be electrically connected to one of the first electrode 60 and the second electrode 80.

In this embodiment, the metal layer 55 is formed of the same material and in the same layer as the first electrode 60, and is provided electrically independently and not electrically connected to the first electrode 60 and the second electrode 80. By forming the metal layer 55 of the same material and in the same layer as the first electrode 60 in this way, it is possible to simplify the manufacturing process without increasing the number of additional steps of forming the metal layer 55. Therefore, the manufacturing cost can be reduced. Of course, the metal layer 55 may be formed of a different material from the first electrode 60 and the second electrode 80, and, even if formed of the same material, may be manufactured by a process different from that of the first electrode 60 and the second electrode 80.

In addition, the metal layer 55 may be formed of the same material as the lead electrode 90. In addition, the metal layer 55 may be formed in the same layer as the lead electrode 90. Furthermore, it is preferable that the metal layer 55 be electrically independent and not electrically connected to the lead electrode 90. That is, because the metal layer 55 is formed of the same material as the electrode forming the piezoelectric element 300 or a film formed of another metal material, the cost can be reduced. In addition, by forming the metal layer 55 in the same layer as the electrode forming the piezoelectric element 300 or the film formed of another metal material, the manufacturing process can be simplified and the cost can be reduced.

In addition, it is preferable that the internal stress of the metal layer 55 be a compressive stress. This is because it is possible to cancel out the internal stress of the vibration plate 50 and the metal layer 55 and suppress warping of the vibration plate 50 and the metal layer 55 by, because the internal stress of the vibration plate 50 of this embodiment is a tensile stress, providing the metal layer 55 in which the internal stress is a compressive stress. Of course, the internal stress of the metal layer 55 may be a tensile stress.

The vibration plate 50 and the metal layer 55 provided with the plurality of the liquid supply ports 16 function as a filter that captures foreign bodies such as bubbles and dust contained in the ink when supplying ink from the manifold portion 31 to the communication portion 13. Because the vibration plate 50 and the metal layer 55 provided with the plurality of liquid supply ports 16 that function as filters in this way, are provided in an eaves shape at the opening of the communication portion 13 on the protective substrate 30 side, they are not supported by the flow path forming substrate 10 when pressure is applied by the ink supplied from the manifold portion 31 to the communication portion 13. However, by providing the metal layer 55, which is tough, on the vibration plate 50, even if the vibration plate 50 and the metal layer 55 provided in the opening of the communication portion 13 are bent and deformed, the formation of cracks or the like in the vibration plate 50 and the metal layer 55 can be suppressed. In particular, in this embodiment, the vibration plate 50 and the metal layer 55 are continuously formed in the circumferential direction of the liquid supply ports 16. By providing the vibration plate 50 and the metal layer 55 continuously in the circumferential direction of the liquid supply ports 16 in such a manner, it is possible to further suppress the formation of cracks in the vibration plate 50 and the metal layer 55 over the entire circumference in the circumferential direction of the liquid supply ports 16. In the case where only the vibration plate 50 is provided in the region where the communication portion 13 and the manifold portion 31 communicate with each other and the liquid supply ports 16 are provided in the vibration plate 50, due to the internal stress of the vibration plate 50 and the ink pressure, damage caused by cracks or the like occurs. In this embodiment, by providing the vibration plate 50 and the metal layer 55 in the region where the communication portion 13 and the manifold portion 31 communicate with each other, damage caused by cracks or the like in the vibration plate 50 and the metal layer 55 due to the internal stress of the vibration plate 50 and ink pressure can be suppressed. Therefore, it is possible to realize the recording head 1 with high reliability.

In addition, in this embodiment, by providing the metal layer 55 only in the region where the liquid supply ports 16 are provided on the vibration plate 50, it is possible to suppress cracks in the vibration plate 50 and the metal layer 55 without changing the configuration of the vibration plate 50 and the piezoelectric element 300. Therefore, it is not necessary to form the vibration plate 50 to be relatively thick with a three-layer to ten-layer multi-layer structure, and it is possible to restrain the vibration plate 50 from impeding the displacement of the piezoelectric element 300.

In addition, because the toughness of the vibration plate 50 and the metal layer 55 around the liquid supply ports 16 is high, cracks are unlikely to occur even when the vibration plate 50 and the metal layer 55 are deformed by pressure fluctuation in the communication portion 13. Therefore, the vibration plate 50 and the metal layer 55 around the liquid supply ports 16 can be deformed by pressure change in the communication portion 13, and the pressure fluctuation in the communication portion 13 can be absorbed. Therefore, it is also possible to reduce or eliminate the compliance portion to be described later in detail.

Further, in this embodiment, the flow path forming substrate 10, the vibration plate 50, the metal layer 55, and the piezoelectric elements 300 provided in the pressure-generating chambers 12 and the like are collectively referred to as a piezoelectric device.

On the other hand, a piezoelectric element holding portion 32 is provided in a region of the protective substrate 30 that faces the piezoelectric element 300. Because the piezoelectric element 300 is formed in the piezoelectric element holding portion 32, the piezoelectric element 300 is protected in a state in which it is hardly affected by the external environment. Further, the piezoelectric element holding portion 32 may be sealed or not sealed.

As a material of the protective substrate 30 such as that described above, for example, a glass, a ceramic material, a metal, a resin, or the like can be used, for example, it is preferable that the protective substrate 30 be formed of a material having substantially the same thermal expansion coefficient as that of the flow path forming substrate 10; in this embodiment, a single-crystal silicon substrate, which is the same material as the flow path forming substrate 10, is used.

In addition, the drive circuit 120 for driving the piezoelectric element 300 is provided on the protective substrate 30. As the drive circuit 120, for example, a circuit board, a semiconductor integrated circuit (IC), or the like can be used. The drive circuit 120 and the lead electrode 90 are electrically connected to each other through the connection wire 121 formed of a conductive wire such as a bonding wire.

Furthermore, a compliance substrate 40 formed of a sealing film 41 and a fixing plate 42 is bonded onto a region of the protective substrate 30 corresponding to the manifold portion 31. The sealing film 41 is formed of a material having low rigidity and flexibility (for example, a polyphenylene sulfide (PPS) film having a thickness of 6 μm), and one surface of the manifold portion 31 is sealed by the sealing film 41. In addition, the fixing plate 42 is formed of a hard material such as metal (for example, stainless steel (SUS) having a thickness of 30 μm or the like). Because the area of the fixing plate 42 facing the manifold portion 31 is an opening portion 43 completely removed in the thickness direction, one surface of the manifold portion 31 is a compliance portion sealed only with the sealing film 41 that is flexible.

In the ink jet recording head 1 of this embodiment such as that described above, ink is taken in from an external ink supply unit (not illustrated), the interior of each of the pressure-generating chambers 12 is filled with ink from the manifold portion 31 to the nozzle 21, and then, in accordance with the recording signal from the drive circuit 120, a voltage is applied between the first electrode 60 and the second electrode 80 corresponding to the pressure-generating chamber 12, and, by bending and deforming the piezoelectric element 300 and the vibration plate 50, the pressure in the pressure-generating chamber 12 increases, and ink is discharged from the nozzle 21.

As described above, in this embodiment, a piezoelectric device used in a recording head that ejects ink includes the flow path forming substrate 10 in which the pressure-generating chambers 12, which are individual liquid chambers that communicate with corresponding ones of the nozzles 21, and the communication portion 13, which is a liquid supply chamber that communicates with the pressure-generating chambers 12, are formed, the vibration plate 50 formed at a position corresponding to the pressure-generating chambers 12 and the communication portion 13 of the flow path forming substrate 10, a plurality of the liquid supply ports 16 formed in the communication portion 13, the piezoelectric elements 300 each including the first electrode 60, the piezoelectric layer 70, and the second electrode 80, and the piezoelectric elements 300 being formed at a position on the vibration plate 50 corresponding to the pressure-generating chambers 12, where the metal layer 55 is stacked on the vibration plate 50 at a position corresponding to the communication portion 13, and the liquid supply ports 16 are provided so as to penetrate the vibration plate 50 and the metal layer 55. By providing the plurality of the liquid supply ports 16 in the vibration plate 50 and the metal layer 55, the generation of cracks in the vibration plate 50 and the metal layer 55 around the plurality of the liquid supply ports 16 can be suppressed due to the toughness of the metal layer 55. In addition, because damage to the vibration plate 50 around the plurality of liquid supply ports 16 can be suppressed without changing the configuration of the piezoelectric element 300 and the vibration plate 50, it is possible to restrain the vibration plate 50 from impeding the deformation of the piezoelectric element 300 and to suppress a decrease in the displacement of the piezoelectric element 300.

In addition, it is preferable that the metal layer 55 be formed of the same material as the first electrode 60 or the second electrode 80. In this embodiment, the metal layer 55 is formed of the same material as the first electrode 60. By forming the metal layer 55 with the same material as the first electrode 60 or the second electrode 80 in this way, it is possible to suppress an increase in materials of different types and to reduce the manufacturing cost. It is needless to say that the metal layer 55 may be formed of a material different from that of the first electrode 60 or the second electrode 80.

In addition, it is preferable that the metal layer 55 be formed in the same layer as the first electrode 60 or the second electrode 80. In this embodiment, the metal layer 55 is formed in the same layer as the first electrode 60. By forming the metal layer 55 in the same layer as the first electrode 60 or the second electrode 80 in this manner, it is possible to form the metal layer 55 simultaneously with the first electrode 60 or the second electrode 80, and it is possible to reduce the cost. Of course, the metal layer 55 may be formed of the same material as the first electrode 60 or the second electrode 80 and formed by a different manufacturing process.

In addition, it is preferable that the metal layer 55 not be electrically connected to the first electrode 60 and the second electrode 80. Accordingly, it is possible to restrain the first electrode 60 and the second electrode 80 from being electrically connected to the ink via the metal layer 55, and it is possible to suppress malfunction of the piezoelectric element 300 due to electric leakage. Of course, the metal layer 55 may be electrically connected to one of the first electrode 60 and the second electrode 80.

In addition, it is preferable that the vibration plate 50 and the metal layer 55 be continuously formed in the circumferential direction of the liquid supply ports 16. Accordingly, by providing the vibration plate 50 and the metal layer 55 continuously in the circumferential direction of the liquid supply ports 16, it is possible to further suppress cracks in the vibration plate 50 and the metal layer 55.

Second Embodiment

Figure 5:
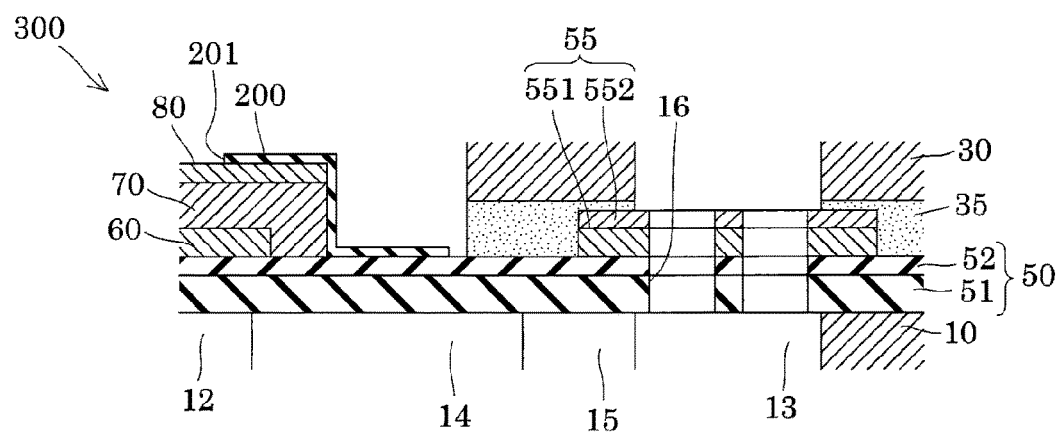
FIG. 5 is an enlarged cross-sectional view of a main portion of a recording head according to a second embodiment of the invention.

FIG. 5 is an enlarged cross-sectional view of a main portion of an ink jet recording head, which is an example of a liquid ejecting head according to a second embodiment of the invention. Further, note that the same reference numerals are given to the same members as those in the above-described embodiment, and redundant description will be omitted.

As illustrated in FIG. 5, a first metal layer 551 and a second metal layer 552 are stacked as the metal layer 55 on the vibration plate 50 provided with supply ports.

In this embodiment, the first metal layer 551 is formed of the same material and in the same layer as the first electrode 60 of the piezoelectric elements 300.

In this embodiment, the second metal layer 552 is formed of the same material and in the same layer as the second electrode 80 of the piezoelectric elements 300.

The metal layer 55 formed by stacking the first metal layer 551 and the second metal layer 552 is provided electrically independently and not electrically connected to the first electrode 60 and the second electrode 80.

In this way, by providing the metal layer 55 in which the first metal layer 551 and the second metal layer 552 are stacked in this manner, without changing the film configuration of the vibration plate 50 and the piezoelectric element 300, it is possible to suppress damage to the vibration plate 50 and the metal layer 55 provided with the liquid supply ports 16. In addition, because damage to the vibration plate 50 around the plurality of the liquid supply ports 16 can be suppressed without changing the configuration of the piezoelectric element 300 and the vibration plate 50, it is possible to restrain the vibration plate 50 from impeding the deformation of the piezoelectric element 300 and to suppress a decrease in the displacement of the piezoelectric element 300.

Other Embodiments

Although each embodiment of the invention has been described above, the basic configuration of the invention is not limited to thereto.

For example, in each of the embodiments described above, a configuration in which the protective film 200 covering the piezoelectric element 300 is not provided in the region where the liquid supply ports 16 are formed is exemplified, but the invention is not limited thereto and the protective film 200 may be provided in a region where the liquid supply ports 16 are provided. That is, in the region between the manifold portion 31 and the communication portion 13, the vibration plate 50, the metal layer 55, and the protective film 200 are stacked, and the liquid supply ports 16 may be provided so as to penetrate through the vibration plate 50, the metal layer 55, and the protective film 200. Further, the position of the protective film 200 is not particularly limited and, in the case where the metal layer 55 is provided in the same layer as the first electrode 60 or the second electrode 80 as in the first and second embodiments, the vibration plate 50, the metal layer 55, and the protective film 200 are stacked in this order. In addition, in the case where the metal layer 55 is provided in the same layer as the lead electrode 90, the protective film 200 is disposed between the metal layer 55 and the vibration plate 50.

In addition, in each of the above-described embodiments, the communication portion 13, which is the liquid supply chamber, is provided so as to communicate with all the individual flow paths in common, but the invention is not particularly limited thereto and the communication portion 13 may be provided for each individual flow path or it may be provided so as to communicate with a group of two or more individual flow paths. However, even when the communication portion 13 is provided for each individual flow path, there is no limitation regarding the communication portion 13 as long as two or more liquid supply ports 16 are provided for each communication portion 13. In addition, in the case where the communication portion 13 communicates with each individual flow path or each group of two or more individual flow paths, because the flow path resistance is dictated by the liquid supply ports 16, for example, the ink supply paths 14 and the communication paths 15 need not be provided in the flow path forming substrate 10. Of course, in each of the above-described embodiments, the ink supply paths 14, the communication paths 15, or both the ink supply paths 14 and the communication paths 15 may be omitted.

In addition, in the above-described first embodiment, the piezoelectric element 300 that is a thin film is used as a pressure-generating element that causes a pressure change in the pressure-generating chambers 12; however, the invention is not limited thereto, and, for example, a thick-film piezoelectric element formed by a method such as attaching a green sheet or the like, a longitudinal vibration type piezoelectric element in which a piezoelectric material and an electrode forming material are alternately stacked and which expands and contracts in the axial direction, or the like can be used.

Figure 6:
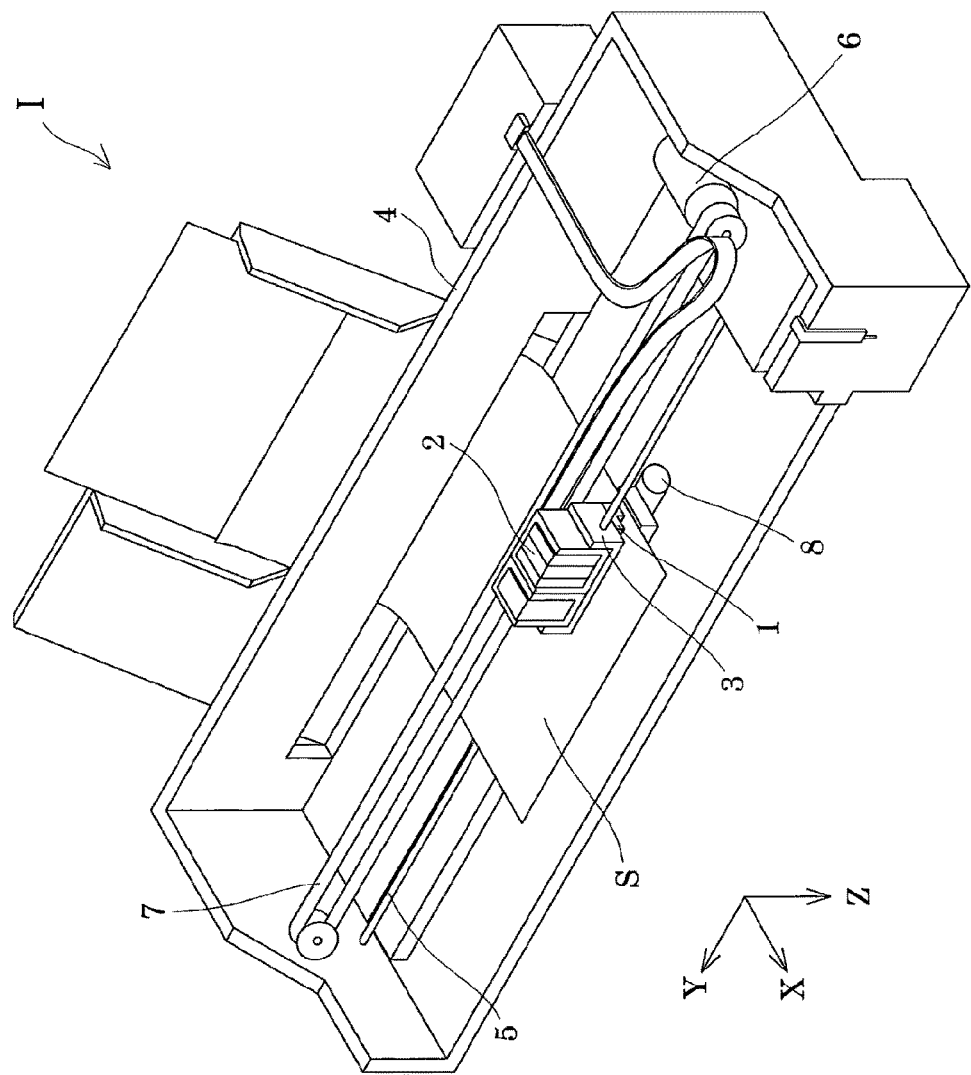
FIG. 6 is a schematic structural diagram of a recording apparatus according to an embodiment of the invention.

In addition, the ink jet recording head 1 of each of these embodiments constitutes a unit of an ink jet recording head unit having ink flow paths communicating with ink cartridges or the like, and is mounted in an ink jet recording apparatus. FIG. 6 is a schematic diagram illustrating an example of the ink jet recording apparatus.

In the ink jet recording apparatus I illustrated in FIG. 6, a plurality of the recording heads 1 are detachably provided with ink cartridges 2 constituting ink supply units, and a carriage 3 on which the recording heads 1 are mounted is attached to an apparatus main body 4 and is provided so as to be movable in the axial direction on a carriage shaft 5.

The driving force of a driving motor 6 is transmitted to the carriage 3 through a plurality of gears (not illustrated) and a timing belt 7, whereby the carriage 3 on which the recording heads 1 are mounted is moved along the carriage shaft 5. On the other hand, the apparatus main body 4 is provided with a transport roller 8 as a mode of transport, and a recording sheet S, which is a recording medium such as paper, is transported by the transport roller 8. Further, the mode of transport for transporting the recording sheet S is not limited to a transport roller and may be a belt, a drum, or the like.

Further, in the above-described ink jet recording apparatus I, the ink cartridges 2 as ink supply units are mounted on the carriage 3, but the invention is not particularly limited thereto, and for example, an ink supply unit such as an ink tank may be fixed to the apparatus main body 4 and the ink supply unit and the recording heads 1 may be connected via a supply pipe such as a tube. In addition, the ink supply unit need not be mounted in the ink jet recording apparatus.

In addition, in the ink jet recording apparatus I described above, the recording heads 1 are mounted on the carriage 3 and move in the main scanning direction; however, the invention is not limited thereto, for example, the invention can also be applied to a so-called line type recording apparatus in which the recording heads 1 are fixed and printing is performed by simply moving the recording sheet S such as paper in the sub-scanning direction.

Furthermore, the invention is broadly applicable to liquid ejecting heads in general, and is used for manufacturing recording heads such as various ink jet recording heads used in image recording apparatuses such as printers, color material ejecting heads used for manufacturing color filters of liquid crystal displays and the like, electrode material ejecting heads used for forming electrodes of organic EL displays, field emission displays (FEDs), and the like, bioorganic material ejecting heads used for manufacturing biochips, and the like. In addition, although the ink jet recording apparatus I has been described as an example of a liquid ejecting apparatus, it can also be used as a liquid ejecting apparatus using another of the above-described liquid ejecting heads.

What is claimed is:

1. A piezoelectric device used in a liquid ejecting head that ejects liquid from a nozzle, comprising:
    a flow path forming substrate in which an individual liquid chamber that communicates with the nozzle, and a liquid supply chamber that communicates with the individual liquid chamber are formed,
    a vibration plate formed at a position corresponding to the individual liquid chamber and the liquid supply chamber of the flow path forming substrate;
    a piezoelectric element including a first electrode, a piezoelectric layer, and a second electrode, the piezoelectric element being formed at a position on the vibration plate corresponding to the individual liquid chamber;
    a metal layer stacked at a position on the vibration plate corresponding to the individual liquid supply chamber; and
    a plurality of liquid supply ports formed by penetrating the metal layer and the vibration plate, the plurality of liquid supply ports configured to filter the ink supplied to the liquid supply chamber.

2. The piezoelectric device according to claim 1, wherein the metal layer is formed of the same material as the first electrode or the second electrode.

3. The piezoelectric device according to claim 2, wherein the metal layer is formed in the same layer as the first electrode or the second electrode.

4. A liquid ejecting head comprising:
the piezoelectric device according to claim 3; and
a manifold portion configured to supply ink to the liquid supply chamber,
wherein the plurality of liquid supply ports are positioned between the manifold portion and the liquid supply chamber, and wherein the liquid supply ports are configured to filter the ink supplied from the manifold portion to the liquid supply chamber.

5. A liquid ejecting apparatus comprising the liquid ejecting head according to claim 4.

6. A liquid ejecting head comprising:
the piezoelectric device according to claim 2; and
a manifold portion configured to supply ink to the liquid supply chamber,
wherein the plurality of liquid supply ports are positioned between the manifold portion and the liquid supply chamber, and wherein the liquid supply ports are configured to filter the ink supplied from the manifold portion to the liquid supply chamber.

7. A liquid ejecting apparatus comprising the liquid ejecting head according to claim 6.

8. The piezoelectric device according to claim 1, wherein the metal layer is not electrically connected to the first electrode and the second electrode.

9. A liquid ejecting head comprising:
the piezoelectric device according to claim 8; and
a manifold portion configured to supply ink to the liquid supply chamber,
wherein the plurality of liquid supply ports are positioned between the manifold portion and the liquid supply chamber, and wherein the liquid supply ports are configured to filter the ink supplied from the manifold portion to the liquid supply chamber.

10. A liquid ejecting apparatus comprising the liquid ejecting head according to claim 9.

11. The piezoelectric device according claim 1, wherein the vibration plate and the metal layer are formed continuously in a circumferential direction of the liquid supply ports.

12. A liquid ejecting head comprising:
the piezoelectric device according to claim 11; and
a manifold portion configured to supply ink to the liquid supply chamber,
wherein the plurality of liquid supply ports are positioned between the manifold portion and the liquid supply chamber, and wherein the liquid supply ports are configured to filter the ink supplied from the manifold portion to the liquid supply chamber.

13. A liquid ejecting apparatus comprising the liquid ejecting head according to claim 12.

14. A liquid ejecting head comprising:
the piezoelectric device according to claim 1; and
a manifold portion configured to supply ink to the liquid supply chamber,
wherein the plurality of liquid supply ports are positioned between the manifold portion and the liquid supply chamber, and wherein the liquid supply ports are configured to filter the ink supplied from the manifold portion to the liquid supply chamber.

15. A liquid ejecting apparatus comprising the liquid ejecting head according to claim 14.

* * * * *